United States Patent
Choi

(10) Patent No.: US 7,443,755 B2
(45) Date of Patent: Oct. 28, 2008

(54) FUSE BOX OF SEMICONDUCTOR DEVICE

(75) Inventor: Hyung Suk Choi, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 196 days.

(21) Appl. No.: 11/321,622

(22) Filed: Dec. 30, 2005

(65) Prior Publication Data

US 2007/0007620 A1     Jan. 11, 2007

(30) Foreign Application Priority Data

Jun. 27, 2005    (KR) ...................... 10-2005-0055743

(51) Int. Cl.
*G11C 11/00*     (2006.01)
(52) U.S. Cl. ..................... 365/225.7; 365/201
(58) Field of Classification Search ................. 365/200, 365/225.7, 201
See application file for complete search history.

(56) References Cited

U.S. PATENT DOCUMENTS

| | | | |
|---|---|---|---|
| 6,353,570 B2 | 3/2002 | Hwang et al. | 365/225.7 |
| 6,724,679 B2 | 4/2004 | Nagasawa et al. | 365/230.03 |
| 6,930,933 B2 | 8/2005 | Jeon | 365/200 |
| 6,982,471 B2 * | 1/2006 | Lee et al. | 257/529 |

FOREIGN PATENT DOCUMENTS

KR     1020040006386 A     1/2004

* cited by examiner

*Primary Examiner*—Michael T Tran
(74) *Attorney, Agent, or Firm*—Townsend and Townsend and Crew LLP

(57) ABSTRACT

A fuse box of a semiconductor device is provided. More specifically, provided is a device of forming a uniformly residual oxide film by rearranging fuse boxes in consideration of an etching ratio depending on plasma density of the semiconductor device to prevent a fuse attack. During a repair etching process to open a fuse box in a chip, an etching loading effect is evenly reflected depending on pattern density of the fuse box so that the residual oxide film is regularly distributed in each fuse of all fuse boxes regardless of the size of an open region. As a result, the fuse attack resulting from an excessive etching process on the oxide film on a small fuse is prevented in fuse blowing to improve yield of FTA (Fixed To Attempt) yield.

9 Claims, 7 Drawing Sheets

FUSE BOX OF SEMICONDUCTOR DEVICE

BACKGROUND OF THE INVENTION

1. Field of the Invention

The present invention generally relates to a fuse box of a semiconductor device. More specifically, the present invention provides a device of forming a uniformly residual oxide film by rearranging fuse boxes in consideration of an etching ratio depending on plasma density of the semiconductor device to prevent a fuse attack.

2. Description of the Related Art

When one of fine cells has a defect, a semiconductor device such as a DRAM or a SRAM is not properly operated so that it is regarded as defective. However, although it is possible to generate defects in a small number of cells due to increase in the integration degree of a semiconductor memory device, it is ineffective to destroy the semiconductor memory devices having defects to reduce yield.

When a defect is generated in a cell of a specific region during a manufacturing process of a semiconductor memory device, a new column or row line has been substituted for a column or row line where a cell having a defect is located.

A metal fuse is used to disconnect a specific device electrically when a defective element is generated in a circuit structure of the semiconductor device. That is, a repair process is performed to prevent the whole memory device from being discarded when a fail is generated in a part of the fuse. In the repair process, a laser cutting is performed in the fuse having the fail to disconnect the fuse having the fail. A fuse is called a wire cut by radiation of laser, and a fuse box is called this cut region and its enclosed region.

The fuse box includes a redundancy fuse box to control cell redundancy, and an option fuse box comprising an option fuse to control an option circuit for evaluating product property or a level of an internal voltage.

However, the conventional redundancy fuse box has a large open region because the number of fuses is large to control redundancy fuses. Relatively, the option fuse box has a smaller open region because there are a few numbers of fuses corresponding to each function.

Hereinafter, a large fuse box refers to a fuse box having a large open region of the fuse box such as the redundancy fuse box, and a small fuse box refers to a fuse box having a small open region of the fuse box such as the option fuse box.

FIGS. 1 and 2 are plane diagrams illustrating a conventional fuse box of a semiconductor device.

The conventional fuse box comprises four banks 3 in a die 1. A large fuse box 4 having a large open region is formed in a peripheral circuit region 2 between bank 3 regions. A small fuse box 5 having a small open region is formed which is separated at a long distance from the large fuse box 4.

FIG. 2 is a diagram illustrating a residual oxide film 6 formed on a fuse f1 of the large fuse box 4 and a residual oxide film 7 formed on a fuse f2 of the small fuse box 5. While a large number of the residual oxide films 6 remains on the fuse f1 when the large fuse box 4 is taken along the line A-A', a few number of the residual oxide films 7 remains on the fuse f2 when the small fuse box 5 is taken along the line A-A'.

A repair etching process which is an open process of the fuse box is to perform a dry etching process by plasma. Here, a loading effect phenomenon occurs which represents a difference of an etching ratio of the oxide film depending on a difference of pattern density. Due to the loading effect phenomenon, the residual oxide film of the fuse f1 of the large fuse box 4 remains to have a thicker thickness than that of the fuse f2 of the small fuse box 5.

As a result, it is important to effectively control the residual oxide film formed on the repair fuse in the fuse box in a DRAM chip in order to secure stability of a blowing process of the fuse.

The residual oxide film formed on the fuse remains to have a predetermined thickness which satisfies the optimum fuse blowing condition. However, when there is a difference between the residual oxide films 6 and 7 depending on the loading effect phenomenon of the large fuse box 4 and the small fuse box 5, it is difficult to set an optimum target of the residual oxide film on the fuse.

When the repair etching process is performed at a target of the residual oxide film adjusted to a redundancy fuse box so as to secure stability of FTA (Fixed To Attempt) yield which represent a repair success rate of a redundancy cell, there is no residual oxide films on the fuse by the loading effect in the repair etching process. As a result, a fuse attack occurs to cause malfunction of an option circuit or generate a fail in the DRAM operation by an abnormal shift of an internal voltage.

The smaller number of the residual oxide films 6 and 7 of fuse lines formed on the edge of the same fuse box remains than that of the residual oxide films 6 and 7 of the fuse line formed on the inner side of the same fuse box to degrade a fuse blowing success rate of the outer fuse lines.

To increase the success rate, a dummy fuse line is added on the outside of the outer fuse lie. In other words, the same number of dummy fuse lines, for example two dummy fuse lines, are formed at both ends of the fuse boxes 4 and 5. The conventional fuse box comprises 4 dummy fuse lines in the large fuse box 4 and other 4 dummy fuse lines in the small fuse box 5.

However, the addition of dummy fuse lines increases the layout area to increase the size of the die and reduce the number of net dies produced in a wafer.

SUMMARY OF THE INVENTION

According to an embodiment of the present invention, a fuse box of a semiconductor device is provided. In particular, the present invention provides a device of forming a uniformly residual oxide film by rearranging a large fuse box and a small fuse box in consideration of an etching ratio depending on plasma density of the semiconductor device to prevent a fuse attack.

In one embodiment of the present invention, a fuse box of a semiconductor device comprises a plurality of bank regions formed on a die; and a plurality of fuse box sets formed in a peripheral circuit region disposed between the neighboring bank regions, the fuse box set including a first fuse box and a second fuse box which adjoin each other with different sizes from each other, wherein the fuse box sets are spaced apart from one another by a predetermined distance in a peripheral circuit region so that a plurality of fuse boxes are formed with a uniform pattern density.

BRIEF DESCRIPTION OF THE DRAWINGS

Other aspects and advantages of the present invention will become apparent upon reading the following detailed description and upon reference to the drawings in which.

DETAILED DESCRIPTION OF THE EXAMPLARY EMBODIMENTS

The present invention will be described in detail with reference to the accompanying drawings. Wherever possible, the same reference numbers will be used throughout the drawings to refer to the same or like parts.

Figure 1:
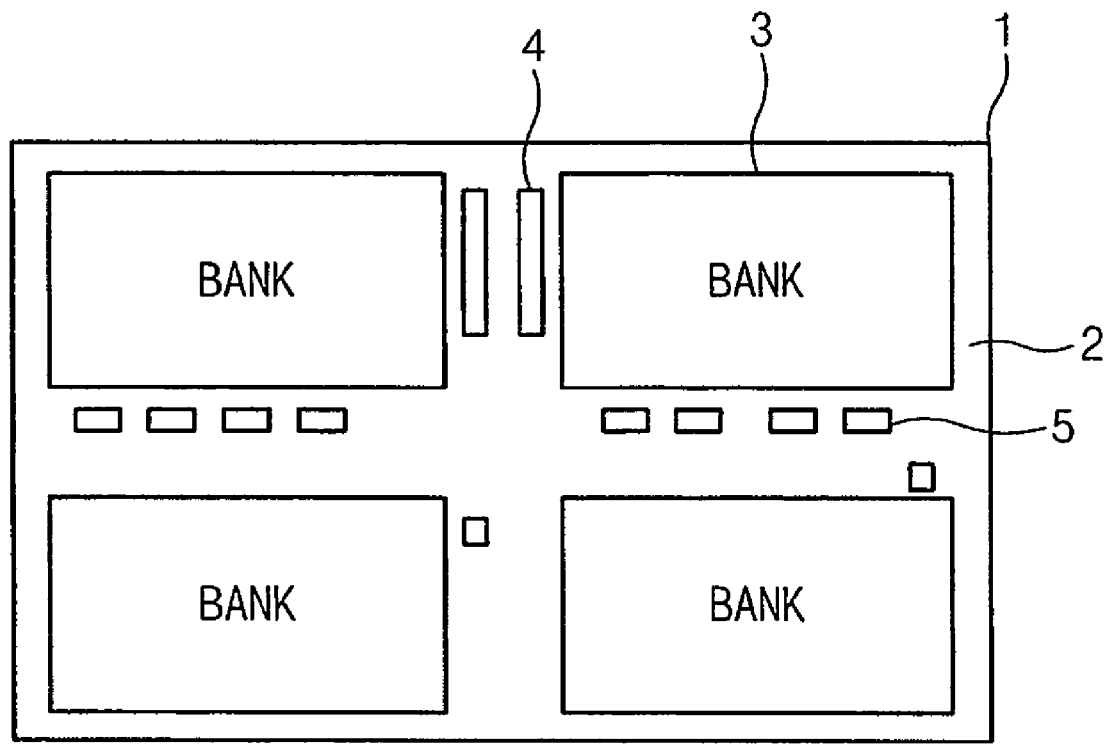
FIGS. 1 and 2 are plane diagrams illustrating a conventional fuse box of a semiconductor device.
Figure 2:
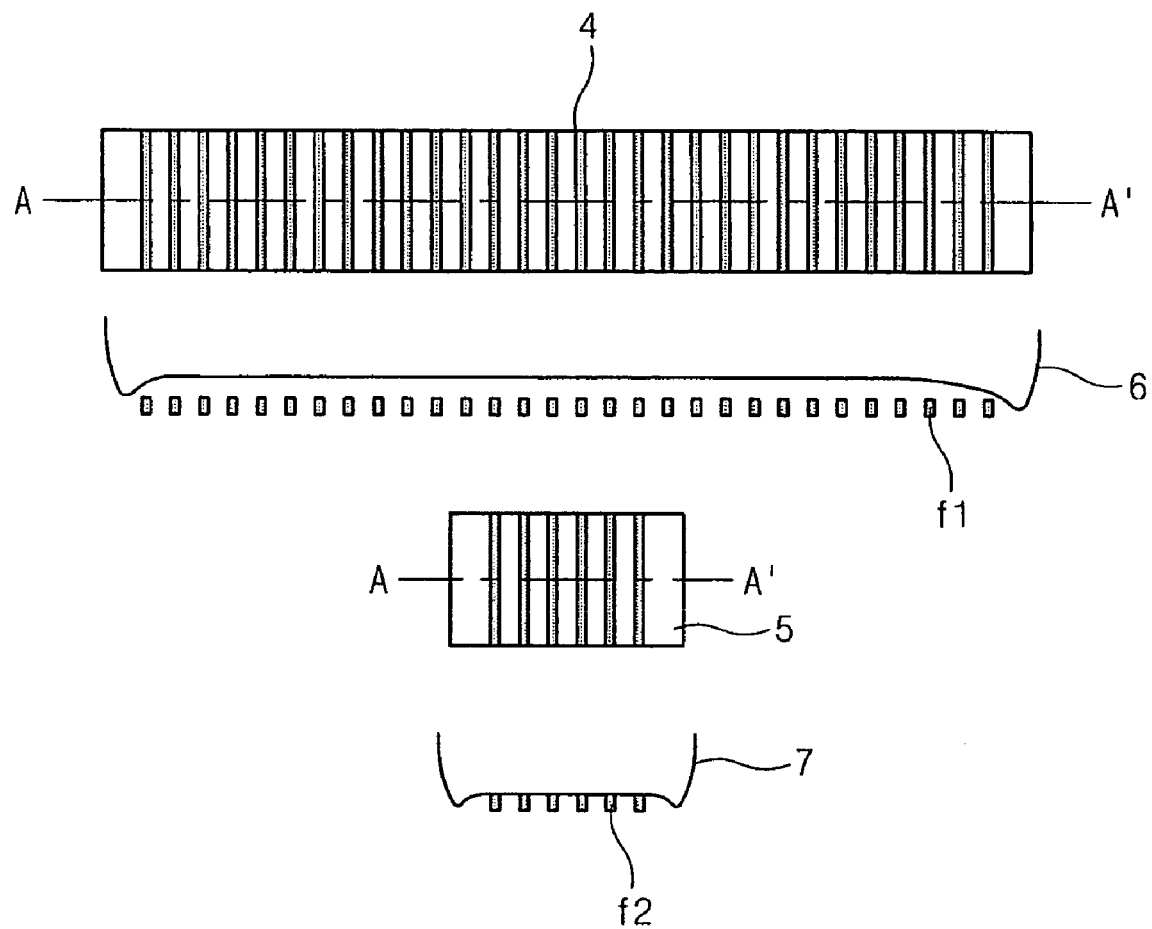
Figure 3:
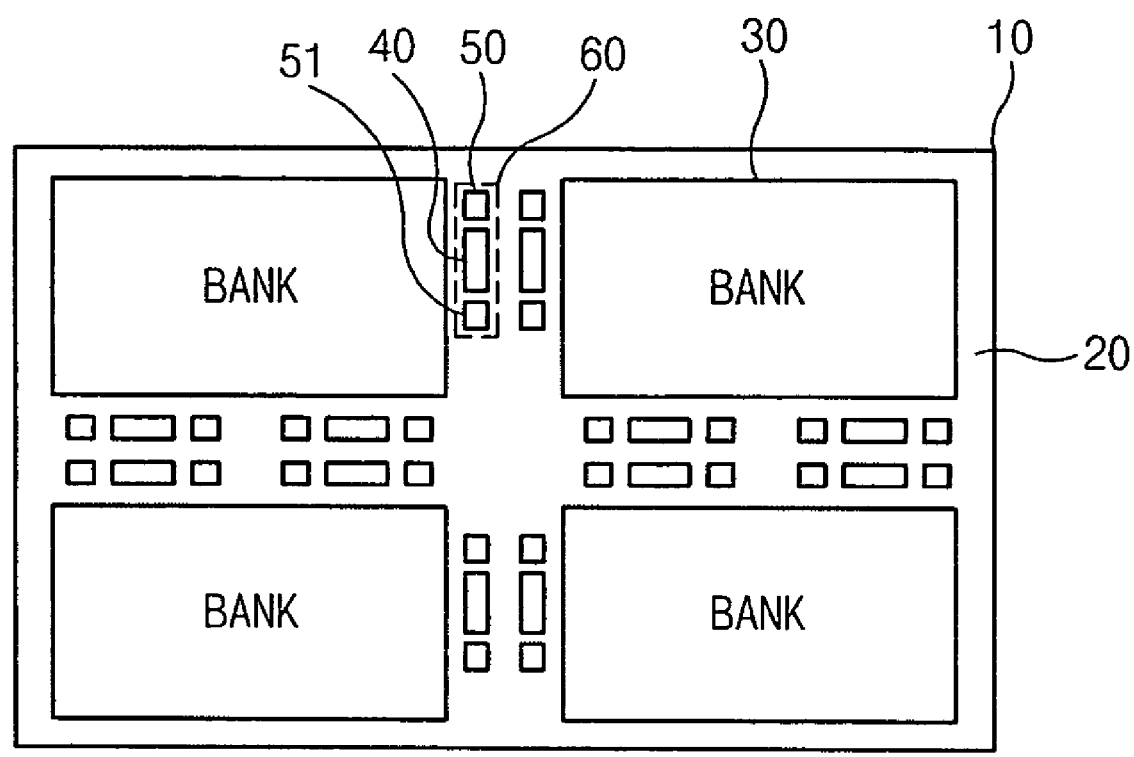
FIGS. 3 and 4 are plane diagrams illustrating a fuse box according to an embodiment of the present invention.

FIG. 3 is a plane diagram illustrating a fuse box according to an embodiment of the present invention.

In this embodiment, four banks 30 are positioned in a die 10, a large fuse box 40 is arranged in a peripheral circuit region 20 disposed between the banks 30, and two small fuse boxes 50 and 51 are arranged in both adjacent sides of the large fuse box 40.

A fuse box set 60 comprises the large fuse box 40 and the two small fuse boxes 50 and 51. The fuse box set 60 is arranged at a regular interval so that all of the fuse boxes may have the same loading effect regardless of the size of the fuse box. Here, the ratio between the first fuse box 40 and the second fuse box 50 and 51 in one fuse box set 60 may range from 1:2 to 1:4, and the length of the fuse box set 60 is preferably equal to or smaller than 250 μm.

Figure 4:
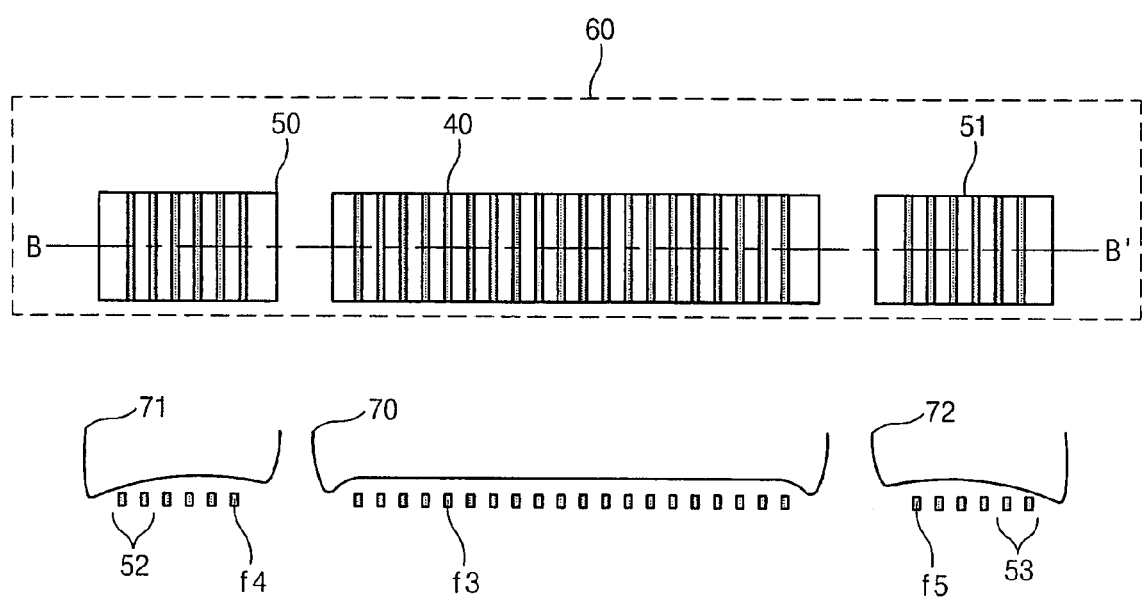

Since the same etching loading effect is generated in the same pattern density, the large fuse box 40 and the small fuse boxes 50 and 51 are required to be in the same pattern group. When the fuse box set 60 is taken along the line B-B' as shown in FIG. 4, the thickness of a residual oxide film 70 formed on a fuse f3 of the large fuse box 40 is the same as that of the residual oxide films 71 and 72 formed on fuses f4 and f5 of the small fuse box 50 and 51.

The oxide film is etched easily in the edge of the open region of the same fuse box in the fuse box set 60. Dummy fuse lines 52 and 53 are formed at both ends of the fuses f4 and f5 to remove the relatively few number of residual oxide films which remain on the open region of the fuse box.

As a result, one fuse box set 60 comprises four dummy fuse lines 52 and 53 to reduce the number of dummy fuse lines in half as compared to the conventional fuse box.

Figure 5:
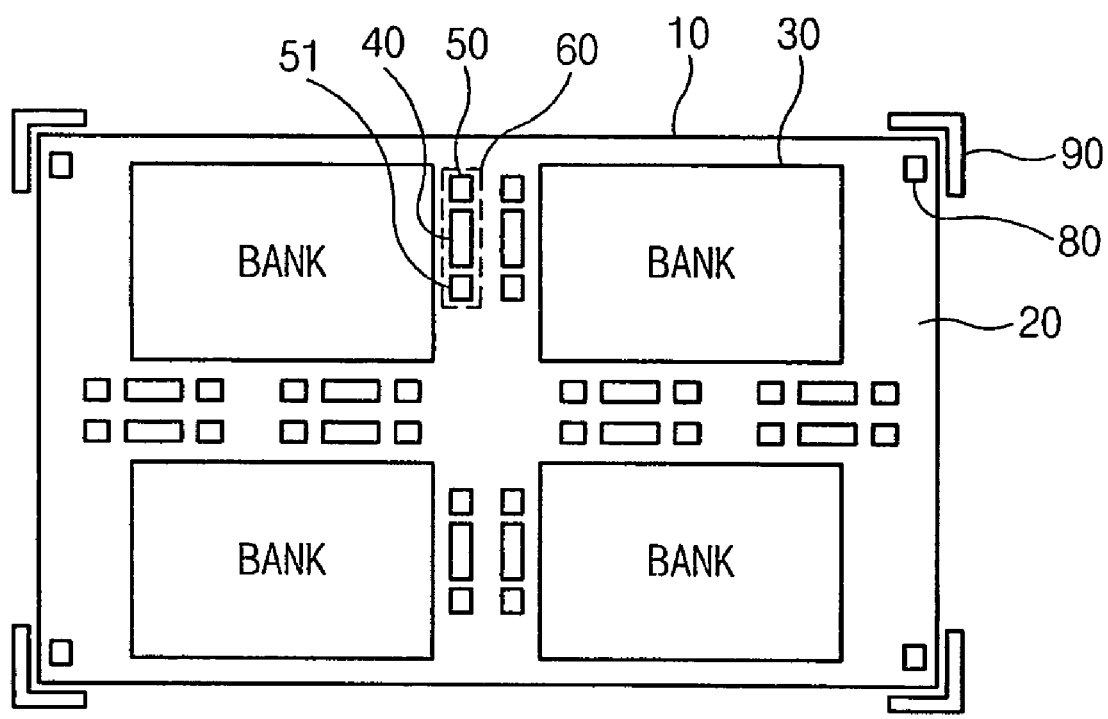
FIGS. 5 through 7 are plane diagrams illustrating a dummy fuse box in a fuse box of a semiconductor device according to an embodiment of the present invention.

A test mode fuse box 80 corresponding to a small fuse box cannot be positioned in the fuse box set 60 with the large fuse box 40 because a circuit occupies a large area. In case of the test mode fuse box 80 required to comprise circuits arranged individually, as shown in FIG. 5, the circuits are positioned in the edge of the bank 30, specifically, in four corners in the die 10. An additional dummy fuse box 90 is located in the outer corner of the die 10.

Figure 6:
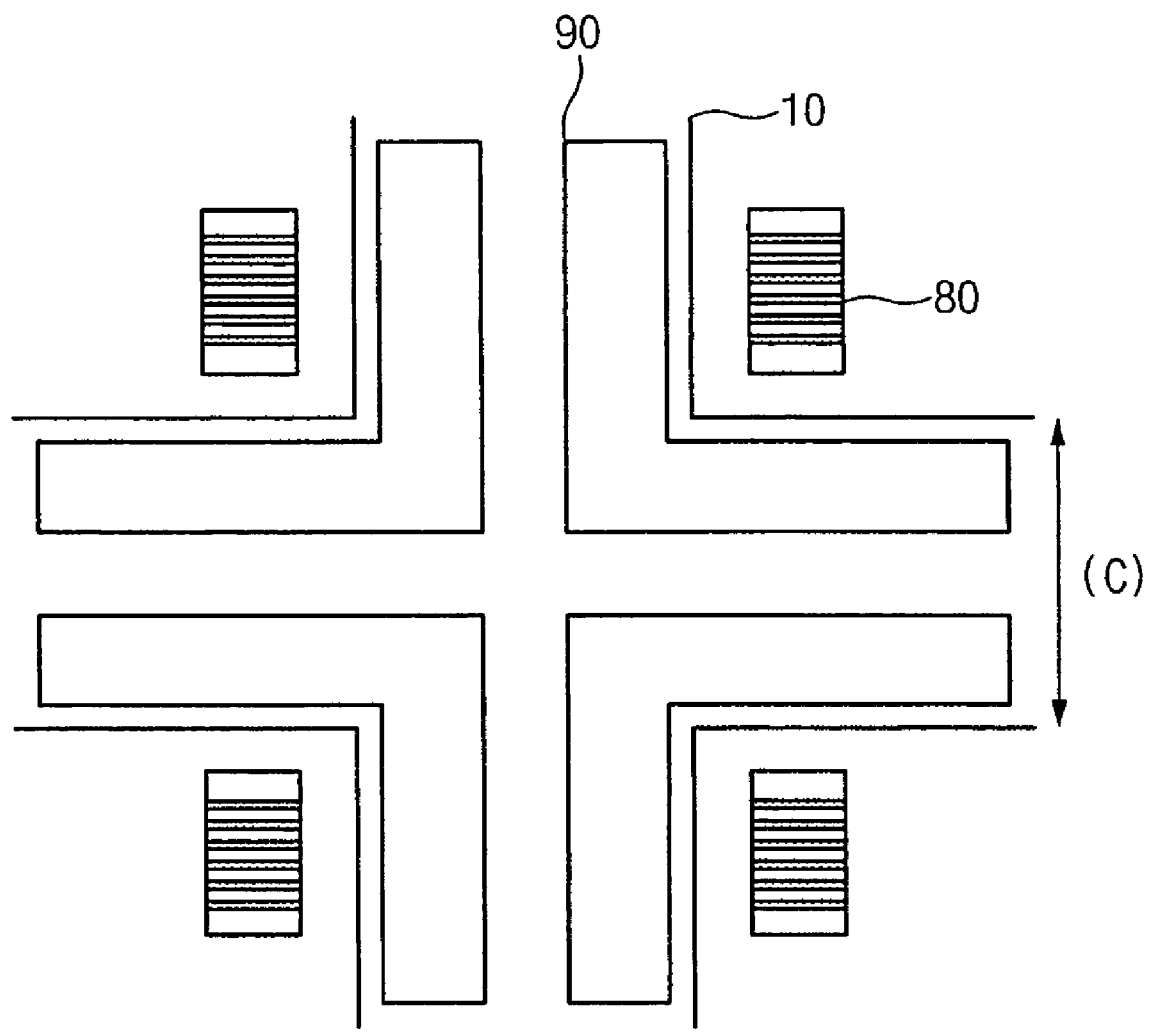

FIG. 6 illustrates the test mode fuse box 80 in the inner corner of the die 10. The dummy fuse box 90 is arranged in a scribe lane C formed for die sawing in the outer region of the adjacent die 10. The size of the scribe lane C is set to be 100 μm.

The individually formed test mode fuse box 80 is arranged with the adjacent dummy fuse box 90 to increase pattern density, thereby reflecting the repair etching loading effect. As a result, the same loading effect as that of the large fuse box 40 formed in the inner region of the die 10 is reflected.

When the dummy fuse box 90 is formed in four corners and their adjacent scribe lane C of the die 10 in a wafer die map, the dummy fuse boxes 90 are gathered around the scribe lane C of the adjacent die to increase the area.

Figure 7:
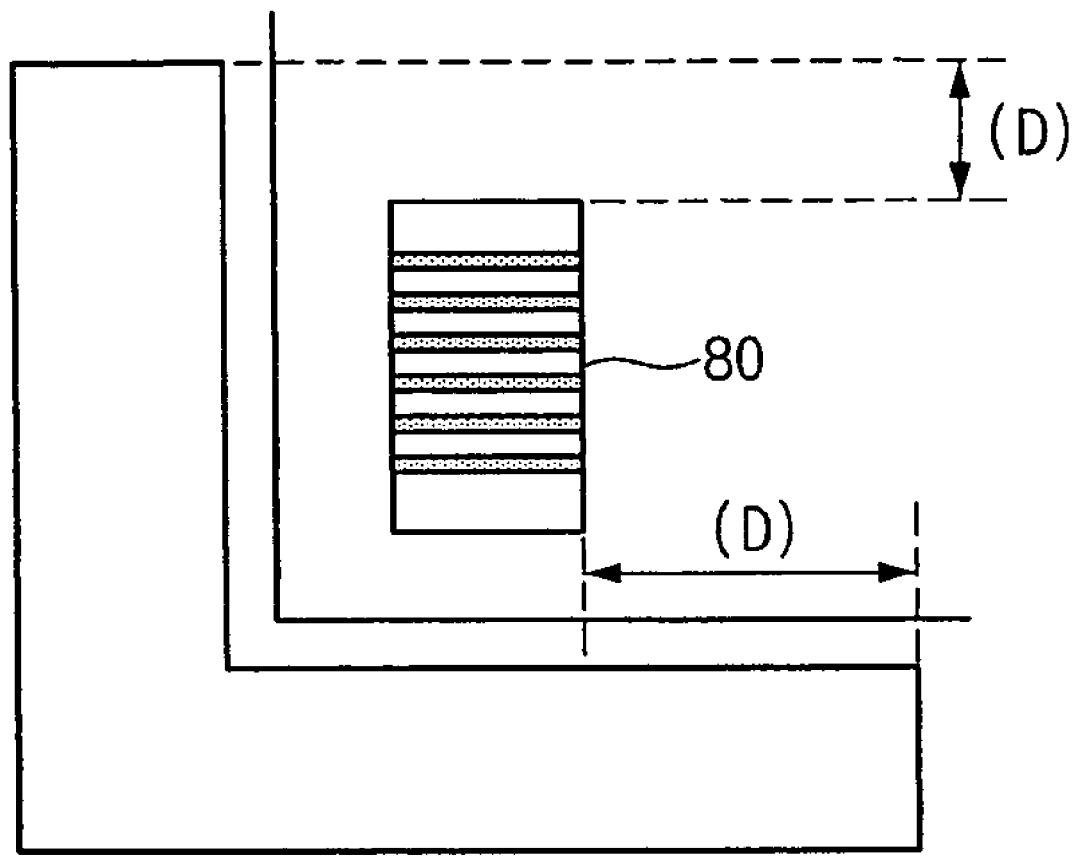

As shown in FIG. 7, the dummy fuse box 90 is opened along the scribe lane C when the neighboring test mode fuse box 80 is opened during the repair etching process. At this point, the width and height of the dummy fuse box 90 are at least 20 μm larger than those of its neighboring test mode fuse box 80, respectively.

In other words, photoresist of the test mode fuse box 80 is selectively opened through an exposure and developing process during the repair etching process. The dummy fuse box 90 is formed by the same process when the oxide film is removed by the repair etching process.

In the embodiment of the present invention, a redundancy fuse, a level trimming fuse and an option fuse which do not form a fuse box to have a predetermined size are divided into a large fuse box and a small fuse box depending on the size of the fuse box open region. The large fuse box and the small fuse box are formed to be adjacent with each other to reflect the same etching loading effect during the repair etching process which is a fuse box open process.

In another embodiment of the present invention, a small fuse box is formed in four corner regions of a wafer chip, and a dummy fuse box is formed not in a main chip but in a scribe lane to reduce the area of the main chip as well as reflect the same etching loading effect as that of the large fuse box in the small fuse box.

As described above, according to an embodiment of the present invention, a residual oxide film on a fuse is formed in all fuse boxes with the same state to stability the residual oxide film during a repair etching process, thereby preventing a fuse attack resulting from an excessive etching process and increasing a FTA success rate.

Additionally, a dummy fuse box is formed in four corners of a wafer chip to be adjacent to the neighboring wafer. The dummy fuse box is formed in four scribe lanes corresponding to a small fuse box included in one chip to improve an etching loading effect.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A fuse box of a semiconductor device comprising:

a plurality of bank regions formed on a die;

a plurality of fuse box sets formed in a peripheral circuit region disposed between neighboring bank regions, each fuse box set including a first fuse box and a second fuse box which adjoin each other, wherein the first fuse box has a different size from the second fuse box; and a plurality of test mode fuse boxes disposed on each inner corner of the die, wherein the plurality of fuse box sets are spaced apart from one another by a predetermined distance in a peripheral circuit region so that the plurality of fuse boxes are formed with a uniform pattern density.

2. The fuse box according to claim 1, wherein a ratio between the first fuse box and the second fuse box in one fuse box set ranges from 1:2 to 1:4, and a length of the fuse box set is equal to or smaller than 250 μm.

3. The fuse box according to claim 1, wherein the first fuse box is a redundancy fuse box.

4. The fuse box according to claim 1, wherein the second fuse box is an option fuse box.

5. The fuse box according to claim 1, further comprising dummy fuse lines formed at both ends of the fuse box set, wherein a same number of the dummy fuse lines are formed at the both ends.

6. The fuse box according to claim 1, further comprising a plurality of dummy fuse boxes formed in a scribe lane, wherein each dummy fuse box is adjacent to each test mode fuse box.

7. The fuse box according to claim 6, wherein each of plurality of dummy fuse boxes is formed larger than its neighboring test mode fuse box along the scribe lane when the neighboring test mode fuse box is open during a repair etching process.

8. The fuse box according to claim 7, wherein a width and a height of the dummy fuse box are at least 20 ỹm larger than those of the neighboring test mode fuse box, respectively.

9. The fuse box according to claim 6, wherein the dummy fuse box is in a shape of "⌊" or "⌉".

* * * * *